(12) United States Patent
Mukasa et al.

(10) Patent No.: US 6,757,192 B2
(45) Date of Patent: Jun. 29, 2004

(54) MAGNETIC RECORDING ELEMENT, MAGNETIC MEMORY, MAGNETIC RECORDING METHOD, METHOD FOR FABRICATING A MAGNETIC RECORDING ELEMENT, AND METHOD FOR FABRICATING A MAGNETIC MEMORY

(75) Inventors: Koichi Mukasa, Sapporo (JP); Makoto Sawamura, Sapporo (JP); Kazuhisa Sueoka, Sapporo (JP); Eiichi Hirota, Hirakata (JP); Ryosho Nakane, Sapporo (JP); Motonori Nakamura, Ebetsu (JP)

(73) Assignee: Hokkaido University, Sapporo (JP)

( * ) Notice: Subject to any disclaimer, the term of this patent is extended or adjusted under 35 U.S.C. 154(b) by 0 days.

(21) Appl. No.: 10/146,932

(22) Filed: May 17, 2002

(65) Prior Publication Data

US 2002/0196658 A1 Dec. 26, 2002

(30) Foreign Application Priority Data

May 21, 2001 (JP) ........................................ 2001-150456

(51) Int. Cl.[7] .............................................. G11C 11/15
(52) U.S. Cl. ....................................................... 365/173
(58) Field of Search ........................... 360/55, 125, 126, 360/110, 131; 428/694, 692, 693; 365/173, 131, 171, 55, 66, 74

(56) References Cited

U.S. PATENT DOCUMENTS

RE35,490 E * 4/1997 Ohura et al. ................. 360/126
6,111,784 A * 8/2000 Nishimura ................... 365/173
6,130,835 A 10/2000 Scheuerlein
6,504,665 B1 * 1/2003 Mukasa et al. ................ 360/55
2002/0018916 A1 * 2/2002 Shinjo .......................... 428/694

FOREIGN PATENT DOCUMENTS

JP 2001-332421 * 11/2001
JP 2002-280637 * 9/2002

OTHER PUBLICATIONS

IEEE Transactions on Magnetics, vol. 37. No. 4, Jul. 2001, "Vertical Magnetization Process in Sub–Micron Permalloy Dots", Kikuchi et al.*

* cited by examiner

Primary Examiner—Alan T. Faber
(74) Attorney, Agent, or Firm—Oliff & Berridge, PLC

(57) ABSTRACT

A magnetic recording element is composed of a first magnetic film to generate spin vortex by an external magnetic field and a second magnetic film having a magnetization perpendicular to the surfaces thereof, and also an insulating layer to control (repress) a current through the magnetic recording element which is formed between the first magnetic film and the second magnetic film. A given external magnetic field is applied to the magnetic recording element, to generate a spin vortex in the first magnetic film and then, generate a vertical magnetization at the center of the spin vortex. Then, a given data is written on the vertical magnetization.

18 Claims, 3 Drawing Sheets

MAGNETIC RECORDING ELEMENT, MAGNETIC MEMORY, MAGNETIC RECORDING METHOD, METHOD FOR FABRICATING A MAGNETIC RECORDING ELEMENT, AND METHOD FOR FABRICATING A MAGNETIC MEMORY

BACKGROUND OF THE INVENTION

1. Field of the Invention

This invention relates to a magnetic recording element and a magnetic memory preferably usable for a Random Access Memory (RAM), and magnetic recording methods utilizing the magnetic recording element and the magnetic memory and methods for fabricating the magnetic recording medium and the magnetic memory.

2. Description of the Prior Art

Conventionally, a semiconductor Random Access Memory, (semi-conductor RAM) composed of a given semiconductor memory is mainly utilized as a Random Access Memory (RAM). If such a semiconductor RAM is used under severe condition, the stability may be deteriorated. The trend of the deterioration in stability becomes conspicuous as the semiconductor element is miniaturized.

Therefore, such an additional process as refresh operation, where a given current is flown to maintain data and thus, realize the stable operation, is required in a semiconductor RAM such as a dynamic Random Access Memory (DRAM). In another semiconductor RAM not requiring such an additional process, the access time is prolonged.

In this point of view, recently, an attention is paid to a Magnetic Random Access Memory (MRAM) utilizing a magnetic recording element. In the MRAM, a signal of "0" or "1" is recorded in accordance with the direction of the magnetization. Since the magnetization direction is not changed only if an external magnetic field is not applied to the MRAM, the data stored in the MRAM is maintained remarkably stable.

A magnetic recording element such as having a GMR (giant magneto-resistive) film or a TMR (tunneling magnetoresistive) film is proposed for the MRAM. In such a magnetic recording element, however, since the magnetic properties such as MR ratio is not satisfied sufficiently, which are required to read out data of "0" and "1", a practically usable MRAM is not realized.

SUMMERY OF THE INVENTION

It is an object of the present invention to provide a new magnetic recording element practically usable for a MRAM and a magnetic memory utilizing the magnetic recording element.

It is another object of the present invention to provide magnetic recording methods utilizing the magnetic recording medium and the magnetic memory, and methods for fabricating the magnetic recording element and the magnetic memory For achieving the above object, this invention relates to a magnetic recording element comprising:

a first magnetic film to generate spin vortex by an external magnetic field, and a second magnetic film, on the first magnetic film, having a magnetization at the center thereof substantially perpendicular to the surfaces thereof.

The inventors had intensely studied to develop a new magnetic recording medium practically usable for a MRAM. As a result, they found out that such a magnetic recording medium can be obtained so that a first magnetic film to generate spin vortex by an external magnetic field and a second magnetic film having the magnetization at the center thereof perpendicular to the surfaces thereof are stacked.

FIGS. 1 and 2 are structural views showing a magnetic recording medium according to the present invention. A magnetic recording medium 10 shown in FIGS. 1 and 2 includes a first magnetic film 1 to generate spin vortex by an external magnetic field and a second magnetic film 2 having the magnetization C perpendicular to the surfaces thereof which is formed on the first magnetic film 1. Herein, the magnetization of the second magnetic film 2 is varied from the perpendicular magnetization at the center to the longitudinal magnetization at the periphery thereof, which is not shown. In addition, an insulating layer 3 is formed between the first magnetic film 1 and the second magnetic film 2 to control (repress) a current through the magnetic recording medium 10.

When an external magnetic field is applied to the first magnetic film 1 forward and then, a spin vortex is generated in the direction A, a given vertical magnetization is generated in the direction B at the center of the spin vortex. On the other hand, when an external magnetic field is applied to the first magnetic film 1 backward and then, a spin vortex is generated in the direction D, a given magnetization is generated in the direction E which is opposite to the direction B.

In FIG. 1, the magnetization B of the first magnetic film 1 and the magnetization C of the second magnetic film 2 are parallel and in FIG. 2, the magnetization B of the first magnetic film 1 and the magnetization E of the second magnetic film 2 are anti-parallel. Therefore, much current is flown on the condition that the magnetic state as shown in FIG. 1 is satisfied than on the condition that the magnetic state as shown in FIG. 2 is satisfied.

Therefore, if data of "0" and "1" are recorded in accordance with the magnetization direction of the first magnetic film 1, the magnetic state can be read out as the amount of a current through the magnetic recording medium.

That is, in the magnetic recording element of the present invention, magnetic recording is performed on the magnetization direction of the spin vortex of the first magnetic film, and magnetic reading is performed on the amount of a current through the magnetic recording element which depends on the direction of the spin vortex of the first magnetic film as in the same manner in a conventional MRAM. Therefore, a new structural MRAM can be obtained from the magnetic recording element according to the present invention. A magnetic memory according to the present invention is constructed so that plural magnetic recording elements according to the present invention are arranged on a given substrate. A practical MRAM is composed of such a magnetic memory according to the present invention.

Herein, the term "spin vortex" means a magnetization state vertically generated in a film. Several preferred embodiments of the magnetic recording element and the magnetic memory will be described hereinafter. Also, magnetic recording methods utilizing the magnetic recording medium and the magnetic memory, and methods for fabricating the magnetic recording element and the magnetic memory will be described hereinafter.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
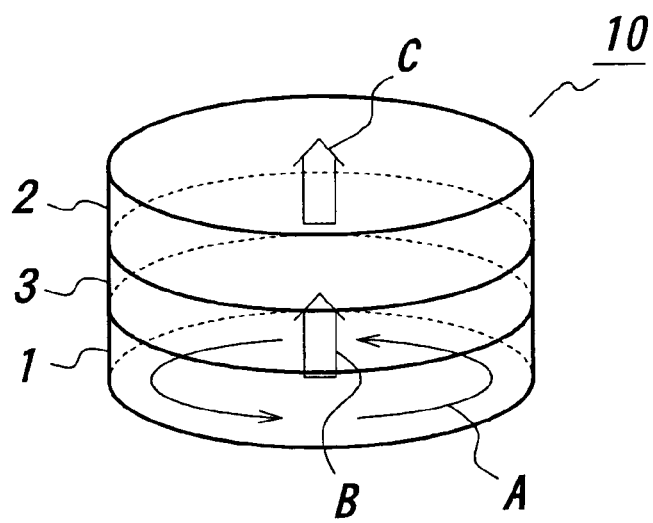
FIG. 1 is a structural view showing a magnetic recording element according to the present invention.
Figure 2:
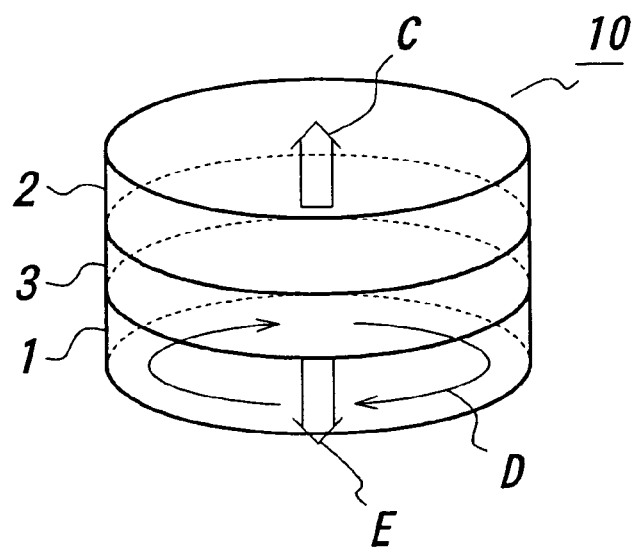
FIG. 2 is another structural view showing a magnetic recording element according to the present invention.

This invention will be described in detail with reference to the accompanying drawings. The configuration of the fist magnetic film is not restricted, but is preferably formed in circular plate-shape as shown in FIGS. 1 and 2. In this case, spin vortex can be easily generated in the first magnetic film 1.

The sort of material to make the first magnetic film 1 is not restricted only if spin vortex is generated in the first magnetic film 1 by an external magnetic field. Preferably, the first magnetic film 1 is made of soft magnetic material such as permalloy, supermalloy or iron, and particularly made of permalloy. In this case, spin vortex can be easily generated in the first magnetic film 1. It is desired that the thickness and the composition of the first magnetic film 1 are controlled so that the coercive force of the first magnetic film 1 is set smaller than the coercive force of the second magnetic film 2.

The diameter of the first magnetic film 1 is preferably set to 0.05–50 $\mu$m so as to generate spin vortex therein effectively and easily by an external magnetic field. If the first magnetic film 1 is made of a soft magnetic material as mentioned above, large spin vortex can be generated even though the diameter of the first magnetic film 1 is set smaller than 0.1 $\mu$m.

The thickness of the first magnetic film 1 is set to 1 $\mu$m or below so as to generate spin vortex therein effectively and easily by an external magnetic field as mentioned above, if the first magnetic film 1 is made of a soft magnetic material as mentioned above, large spin vortex can be generated even though the thickness of the first magnetic-film 1 is reduced up to 1 nm.

The configuration of the second magnetic film is not restricted because spin vortex is not generated therein. According to the fabricating method of magnetic recording element of the present invention, however, the configuration of the second magnetic film 2 is similar to the one of the first magnetic film 1 because they are fabricated at the same time by means of a resist pattern. Therefore, if the shape of the first magnetic film 1 is set to be circular plate, the shape of the second magnetic film 2 results in circular plate.

The sort of material to make the second magnetic film 2 is not restricted only if the magnetization is perpendicular to the surfaces thereof. In the view of the large saturated magnetization and the formation of easy axis of magnetization perpendicular to the surfaces of the second magnetic film 2, however, it is desired that the second magnetic film 2 is made of Co or Co-based alloy. Particularly, the film 2 is preferably made of Co because Co is easily available.

The thickness of the second magnetic film 2 is set to 1 $\mu$m or below so as to create easy axis of magnetization therein perpendicular to the surfaces thereof. If the second magnetic film 2 is made of a magnetic material such as Co as mentioned above, the saturated magnetization of the second magnetic film 2 can be enlarged even though the thickness of the second magnetic film 2 is reduced up to 0.05 $\mu$m.

Therefore, if the first magnetic film 1 is made of a soft magnetic material such as permalloy and the second magnetic film 2 is made of a magnetic material such as Co as mentioned above, the magnetic recording element 10 can be miniaturized sufficiently. Then, if such minute magnetic recording elements are arranged on a given substrate, a high density magnetic memory can be obtained according to the present invention. If the sizes of the first magnetic film 1 and the second magnetic film 2 are enlarged appropriately, the size of the magnetic recording element 10 can be enlarged up to the order of several ten $\mu$m.

As mentioned above, in the case of reading recorded data from the magnetic recording element 10, a given electric field is applied perpendicularly to the magnetic recording element 10, and then, data of "0" and "1" are read out on the amount of a current through the magnetic recording element 10. If the second magnetic film 2 is formed directly on the first magnetic film 1, however, the absolute value of the current through the magnetic recording element 10 becomes too large, and thus, the amount of the current may not be determined precisely.

In this case, it is desired that the insulating layer 3 is formed between the first magnetic film 1 and the second magnetic film 2 as shown in FIGS. 1 and 2. When a given electric field is applied perpendicularly to the magnetic recording element 10, only a given tunnel current is flown through the insulating layer 3, so that the absolute value of the current through the magnetic recording element 10 can be reduced appropriately.

The thickness of the insulating layer 3 is preferably set within 1–10 nm. The insulating layer 3 is preferably made of an insulating material such as alumina, silica, magnesium oxide or strontium-titanium oxide (STO).

Figure 3:
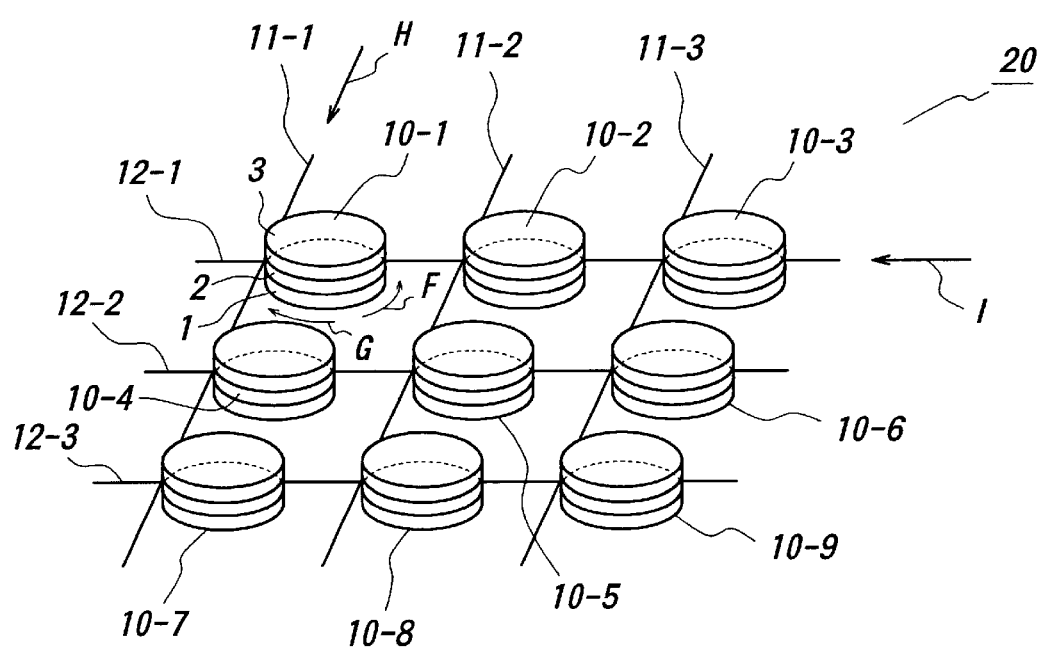
FIG. 3 is a schematic view showing a magnetic memory according to the present invention.

FIG. 3 is a schematic view showing a magnetic memory according to the present invention. In a magnetic memory 20 shown in FIG. 3, magnetic recording elements 10-1 through 10-9 are arranged in matrix on a given substrate (not shown), Then, wires 11-1 through 11-3 and 12-1 through 12-3 are arranged so as to surround the magnetic recording elements 10-1 through 10-9.

When given external magnetic fields are applied to the magnetic recording elements 10-1 through 10-9, respectively, the writing for each of the elements is performed as shown in FIGS. 1 and 2. A magnetic recording method according to the present invention will be described hereinafter with reference to the magnetic memory 20 shown in FIG. 3.

For example, the writing for the magnetic recording element 10-1 is performed by flowing a current in the wires 12-1 and 12-2 along the direction F surrounding the element 10-1. In this case, an upward magnetic field is generated within the region surrounded by the wires 12-1 and 12-2, in accordance with the direction of the current F. Therefore, a spin vortex is generated in the first magnetic film 1 by the upward magnetic field and thus, the upward magnetization B is generated therein as shown in FIG. 1. As a result, data of "0" or "1" can be recorded in the magnetic recording medium 10-1 in accordance with the direction of the magnetization B.

When a current is flown in the wires 12-1 and 12-2 along the direction G surrounding the magnetic recording element 10-1, a downward magnetic field is generated within the region surrounded by the wires 12-1 and 12-2, in accordance with the direction of the current G. Therefore, a spin vortex is generated in the first magnetic film 1 by the downward magnetic field, and thus, the downward magnetization E is generated in the first magnetic film 1 as shown in FIG. 2. As a result, the date of "0" or "1" is rewritten to the data of "1" or "0".

As is explained in FIGS. 1 and 2, the second magnetic film 2 is magnetized in the direction C perpendicular to the surfaces thereof. Therefore, when a given electric field is applied perpendicularly to the magnetic recording element 10-1, a current through the magnetic recording element 10-1 is varied, depending on the magnetic state of the first magnetic element 10-1. That is, much current is flown through the magnetic recording element 10-1 in the magnetic state of the magnetization B than in the magnetic state of the magnetization E. As a result the data of "0" or "1" can be read out by measuring the amount of the current through the magnetic recording element 10.

If the absolute value of a current to be flown is adjusted (increased), a spin vortex can be generated in a magnetic recording element even though the current is not flown in all of the wires surrounding the magnetic recording element. For example, since the magnetic recording elements 10-1, 10-4 and 10-7 are arranged in the vicinity of the wire 11-1, if a large current is flown in the wire 11-1 in the direction H, spin vortexes are generated in the elements 10-1, 10-4 and 10-7 only by the magnetic field generated by the large current.

Also, since the magnetic recording elements 10-1 through 10-3 are arranged in the vicinity of the wire 12-1, spin voltex can be generated in the magnetic recording elements 10-1 through 10-3, respectively only if a large current is flown in one direction, e.g., designated by the arrow 1 in the wire 12-1.

Moreover, for example in the magnetic recording element 10-1, if large currents are flown in the wires 11-1 and 12-1 in the similar directions H and I, respectively, a spin vortex can be generated effectively in the magnetic recording element 10-1.

Figure 4:
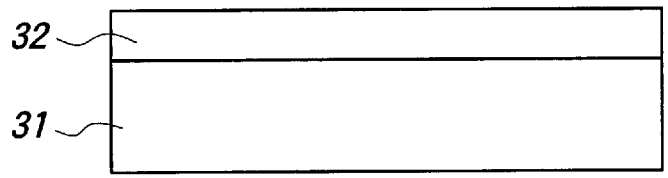
FIG. 4 is a cross sectional view showing one step in a fabricating method of magnetic recording element according to the present invention.
Figure 5:
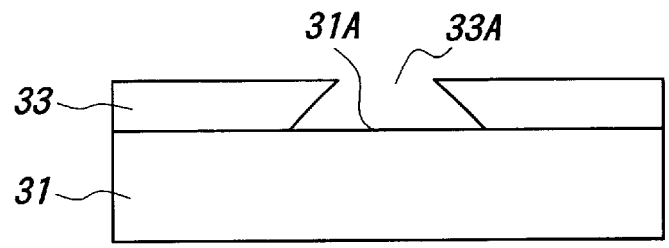
FIG. 5 is a cross sectional view showing a step after the step shown in FIG. 4.

Then, a fabricating method of magnetic recording element according to the present invention will be described hereinafter. FIGS. 4–7 are cross sectional views showing the steps of the fabricating method of the present invention. First of all, as shown in FIG. 4, a resist film 32 is coated in a thickness of 0.1–5 $\mu$m on a given substrate 31 by means of a spin coating machine. Then, the resist film 32 is exposed and developed, to form a resist pattern 33 having an opening 33A where the main surface 31A of the substrate 31 is exposed, as shown in FIG. 5.

Figure 6:
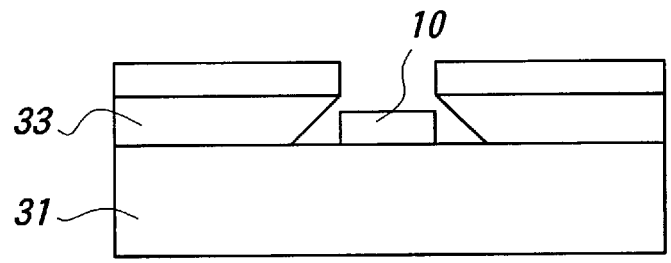
FIG. 6 is a cross sectional view showing a step after the step shown in FIG. 5.
Figure 7:
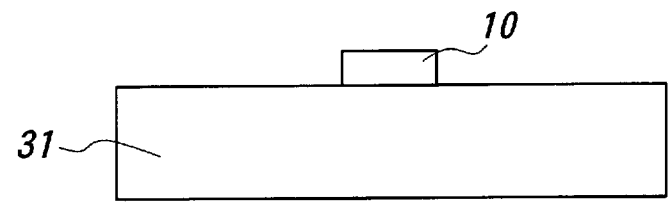
FIG. 7 is a cross sectional view showing a step after the step shown in FIG. 6.

Then, as shown in FIG. 6, the first magnetic film, the second magnetic film and if necessary also the insulating layer are formed on the substrate 31 via the resist pattern 33 as a mask in turn by means of sputtering or vacuum deposition, to fabricate the magnetic recording element 10 within the opening 33A. Then, the resist pattern 33 is lifted-off, to fabricate the magnetic recording element 10 on the substrate 31 as shown in FIG. 7.

The magnetic memory of the present invention can be fabricated in the same manner as mentioned above. That is, in the step shown in FIG. 5, a resist pattern having plural openings is made on the same substrate. Then, in the step shown in FIG. 6, plural magnetic recording elements are fabricated via the resist pattern within the openings, respectively.

The magnetic recording element may be fabricated as follows. That is, a multilayered structure is fabricated where the first magnetic film, the second magnetic film and if necessary, also the insulating layer are formed and stacked uniformly. Then, the multilayered structure is partially etched via a given mask by means of ion milling using Ar ions until the substrate is partially exposed, to fabricate the magnetic recording element. In this case, the magnetic memory may be fabricated by using a resist pattern with plural openings as a mask.

Although the present invention was described in detail with reference to the above examples, this invention is not limited to the above disclosure and every kind of variation and modification may be made without departing from the scope of the present invention.

As mentioned above, according to the present invention, a new structural magnetic recording element where writing is performed in accordance with the direction of the magnetization generated through spin vortex can be provided, and also, a magnetic memory including the magnetic recording element can be obtained. Therefore, if the magnetic recording element or the magnetic memory is employed, a MRAM practically usable can be provided.

What is claimed is:

1. A magnetic recording element, comprising:
   a first magnetic film to generate spin vortex by an external magnetic field, and
   a second magnetic film, on said first magnetic film, having a magnetization at a center thereof substantially perpendicular to a surface thereof and in parallel or anti-parallel to a magnetization of said first magnetic film generated at a center thereof originated from said spin vortex.

2. A magnetic recording element as defined in claim 1, wherein said first magnetic film is formed in a circular plate-shape.

3. A magnetic recording element as defined in claim 1, wherein said first magnetic film is made of permalloy.

4. A magnetic recording element as defined in claim 1, wherein a diameter of said first magnetic film is set within 0.05–50 $\mu$m.

5. A magnetic recording element as defined in claim 1, wherein a thickness of said first magnetic film is set to 1 $\mu$m or below.

6. A magnetic recording element as defined in claim 1, wherein said second magnetic film is made of Co.

7. A magnetic recording element as defined in claim 1, wherein a thickness of said second magnetic film is set to 1 $\mu$m or below.

8. A magnetic recording element as defined in claim 1, further comprising an insulating film between said first magnetic film and said second magnetic film.

9. A magnetic recording element as defined in claim 8, wherein a thickness of said insulating layer is set within 1–10 nm.

10. A magnetic memory comprising plural magnetic recording elements as defined in claim 1 which are arranged in plane on a given substrate.

11. A magnetic memory as defined in claim 10, further comprising wires which are arranged so as to surround said magnetic recording elements, respectively.

12. A magnetic recording method, comprising:
    arranging in plane plural magnetic recording elements as defined in claim 1 on a given substrate,
    arranging wires on said substrate so as to surround said magnetic recording elements, respectively, flowing a current in at least one of said wires in forward direction, to generate a forward spin vortex and then, generate a forward magnetization in at least one of said magnetic recording elements, and magnetically writing a given data on said forward magnetization.

13. A magnetic recording method as defined in claim 12, further comprising:

flowing a current in said at least one wire in backward direction which is opposite to said forward direction, to generate a backward spin vortex and then, generate a backward magnetization which is opposite to said forward magnetization in said at least one magnetic recording element, and magnetically rewriting said data already written on said backward magnetization.

14. A method for fabricating a magnetic recording element, comprising:

forming a resist film uniformly on a given substrate, exposing and developing said resist film, to fabricate a resist pattern having an opening where a main surface of said substrate is exposed, and forming a first magnetic film to generate spin vortex by an external magnetic field and a second magnetic film having a magnetization perpendicular to surfaces thereof in turn via said resist pattern, to fabricate a magnetic recording element including said first magnetic film and said second magnetic film within said opening.

15. A fabricating method as defined in claim 14, further comprising the step of forming an insulating layer between said first magnetic film and said second magnetic film.

16. A method for fabricating a magnetic memory, comprising:

forming a resist film uniformly on a given substrate, exposing and developing said resist film, to fabricate a resist pattern having plural openings where a main surface of said substrate is exposed, and forming a first magnetic film to generate spin vortex by an external magnetic field and a second magnetic film having a magnetization at a center thereof perpendicular to surfaces thereof in turn via said resist pattern, to fabricate plural magnetic recording elements including said first magnetic film and said second magnetic film within said openings, respectively.

17. A fabricating method as defined in claim 16, further comprising the step of forming an insulating layer between said first magnetic film and said second magnetic film.

18. A fabricating method as defined in claim 16, further comprising the step of forming wires so as to surround said magnetic recording elements, respectively.

* * * * *